(12) United States Patent
Imahashi (10) Patent No.: US 7,821,029 B2
(45) Date of Patent: Oct. 26, 2010

(54) ELECTROSTATIC PROTECTION ELEMENT

(75) Inventor: Manabu Imahashi, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/542,998

(22) Filed: Aug. 18, 2009

(65) Prior Publication Data

US 2010/0044750 A1    Feb. 25, 2010

(30) Foreign Application Priority Data

Aug. 22, 2008    (JP) .............................. 2008-213884

(51) Int. Cl.
*H01L 29/74* (2006.01)
(52) U.S. Cl. ................. 257/173; 257/355; 257/E29.211
(58) Field of Classification Search ................. 257/173, 257/174, 355, E29.211, 356, 357, 499, 501
See application file for complete search history.

(56) References Cited

U.S. PATENT DOCUMENTS

| | | | |
|---|---|---|---|
| 5,747,834 A | 5/1998 | Chen et al. | |
| 5,808,342 A | 9/1998 | Chen et al. | |
| 7,202,531 B2* | 4/2007 | Imahashi et al. | ............ 257/355 |
| 7,329,925 B2* | 2/2008 | Tseng | ......................... 257/355 |
| 7,675,141 B2* | 3/2010 | Otake | ......................... 257/565 |
| 2006/0086983 A1 | 4/2006 | Nawate | |
| 2007/0210419 A1 | 9/2007 | Nawate et al. | |

FOREIGN PATENT DOCUMENTS

| JP | 09-191082 A | 7/1997 |
|---|---|---|
| JP | 2006-128293 A | 5/2006 |

* cited by examiner

*Primary Examiner*—Roy K Potter
(74) *Attorney, Agent, or Firm*—McDermott Will & Emery LLP (57) ABSTRACT

An electrostatic protection element relating to the present invention comprises a P-type semiconductor and an N-type first impurity layer provided in the semiconductor substrate. The first impurity layer comprises a P-type second impurity layer functioning as a gate. The second impurity layer comprises an N-type third impurity layer functioning as a cathode. Further, the first impurity layer comprises an N-type fourth impurity layer spaced apart from the second impurity layer at a distance. The fourth impurity layer comprises a P-type fifth impurity layer functioning as an anode and an N-type sixth impurity layer. Then, in the electrostatic protection element, an impurity concentration of the fourth impurity layer is higher than that of the first impurity layer, and a bottom of the fourth impurity layer is deeper than that of the second impurity layer.

16 Claims, 11 Drawing Sheets

ELECTROSTATIC PROTECTION ELEMENT

CROSS-REFERENCE TO RELATED APPLICATION

The disclosure of Japanese Patent Application No. 2008-213884 filed Aug. 22, 2008 including specification, drawings and claims is incorporated herein by reference in its entirety.

BACKGROUND OF THE INVENTION

1. Field of the Invention

The present invention relates to an electrostatic protection element to be mounted onto a semiconductor integrated circuit device, and particularly relates to an electrostatic protection element having a thyristor structure.

2. Description of the Related Art

Recently, in association with miniaturization and high integration of a pattern in a semiconductor integrated circuit device, an electrostatic protection element for protecting a semiconductor integrated circuit device from static electricity that electrically charges a human body or machines also requires miniaturization. The electrostatic protection element is connected to an Input/Output terminal or a power supply terminal of the semiconductor integrated circuit device. When surges are applied to the I/O terminal and the power supply terminal, an influx of a surge current by the surges into an internal circuit that is a target for protection (a circuit to be protected) is prevented. This type of electrostatic protection element is also referred to as ESD (electro static discharge) protection element, and an NPN bipolar transistor and a thyristor structure are variously proposed.

When the electrostatic protection element is composed of the same constituent elements as those of the internal element comprising the internal circuit, the electrostatic protection element can be simultaneously manufactured in the same process as the internal element. For example, when the internal circuit includes an NPN bipolar transistor (hereafter, referred to as NPN transistor), the NPN transistor is often used as the electrostatic protection element. However, because so-called holding voltage $V_h$ (collector emitter junction breakdown voltage (BVCEO) in the base opened state) in the snapback characteristic of the NPN transistor is small, when the internal circuit contains a high breakdown voltage semiconductor element and a low breakdown voltage semiconductor element, the holding voltage $V_h$ tends to be lower than a breakdown voltage of the high breakdown voltage semiconductor element. Consequently, the NPN transistor is hardly used for a use of the protection of the high breakdown voltage semiconductor element.

Figure 10:
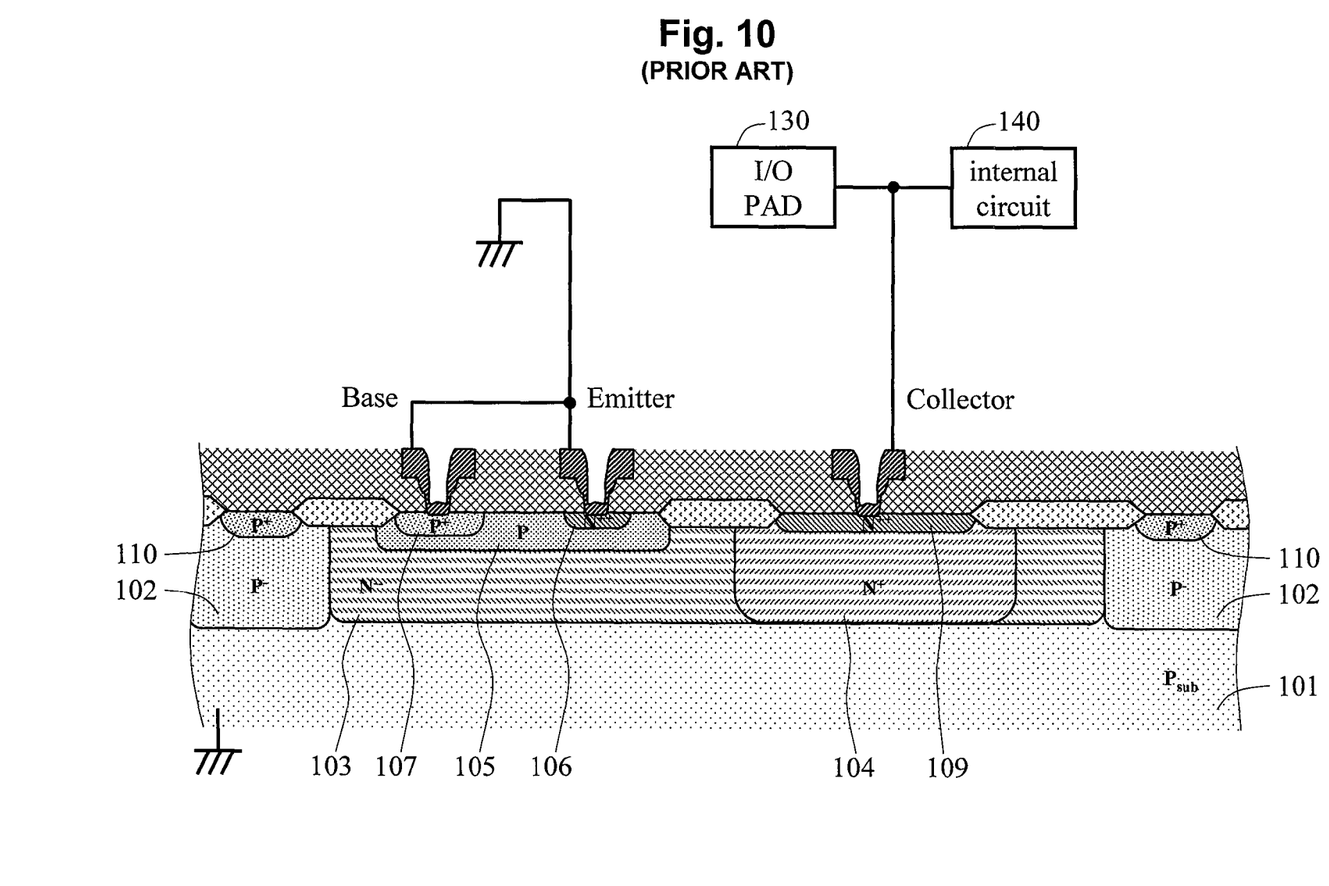
FIG. 10 is a cross sectional view showing a structure of a conventional electrostatic protection element.

However, recently, a structure of the NPN transistor where the holding voltage $V_h$ has been improved is proposed, and the NPN transistor has become used for the electrostatic protection of the high breakdown voltage semiconductor element. For example, Japanese Laid-Open Patent Application Publication No. 2006-128293 discloses the structure of the NPN transistor for electrostatic protection that is equipped with a deep high-concentration N-type diffusion layer in a collector contact region. FIG. 10 is a cross sectional view showing the electrostatic protection element of the semiconductor integrated circuit device disclosed in this conventional art.

As shown in FIG. 10, the NPN transistor for electrostatic protection is provided with a low-concentration N-type diffusion layer 103 (hereafter, referred to as $N^{--}$-type diffusion layer 103) formed in a P-type semiconductor substrate 101. A P-type diffusion layer 105 to be a base of the NPN transistor is formed in a surface portion of the $N^{--}$-type diffusion layer 103, and a high-concentration N-type diffusion layer 106 (hereafter, referred to as $N^{++}$-type diffusion layer 106) to be an emitter of the NPN transistor is formed in a surface portion of the P-type diffusion layer 105. Further, a high-concentration N-type diffusion layer 104 (hereafter, referred to as $N^+$-type diffusion layer 104) constructing a part of a collector region of the NPN transistor is formed in the $N^{--}$-type diffusion layer 103 spaced apart from the P-type diffusion layer 105 laterally at a predetermined distance to be deeper than the P-type diffusion layer 105 and throughout the depth to reach the P-type semiconductor substrate 101.

A P-type separating layer composed of a low-concentration P-type diffusion layer 102 (hereafter, referred to as $P^-$-type diffusion layer 102) and a high-concentration P-type diffusion layer 110 formed in a surface portion of the $P^-$-type diffusion layer 102 is located around a circumference of the $N^{--}$-type diffusion layer 103. Further, a high-concentration P-type diffusion layer 107 (hereafter, referred to as $P^+$-type diffusion layer 107) for ohmic contact and a high-concentration N-type diffusion layer 109 (hereafter, referred to as $N^{++}$-type diffusion layer 109) are formed in the contact region of the P-type diffusion layer 105 and the contact region of the $N^+$-type diffusion layer 104, respectively.

In the NPN transistor for electrostatic protection having the configuration described above, as shown in FIG. 10, the $P^+$-type diffusion layer 107, which is a base contact, and the $N^{++}$-type diffusion layer 106, which is the emitter, are short-circuited by an aluminum wire and connected to the lowest potential, such as GND (grounding potential). Further, the $N^{++}$-type diffusion layer 109, which is a collector contact, is connected to an I/O terminal 130 (hereafter, referred to as I/O PAD 130) and an internal circuit 140 formed on the semiconductor substrate 101, by an aluminum wire. Herein, the internal circuit 140 is a circuit composed of the internal elements and is a target circuit for protection to realize a function of the semiconductor integrated circuit device.

Figure 11:
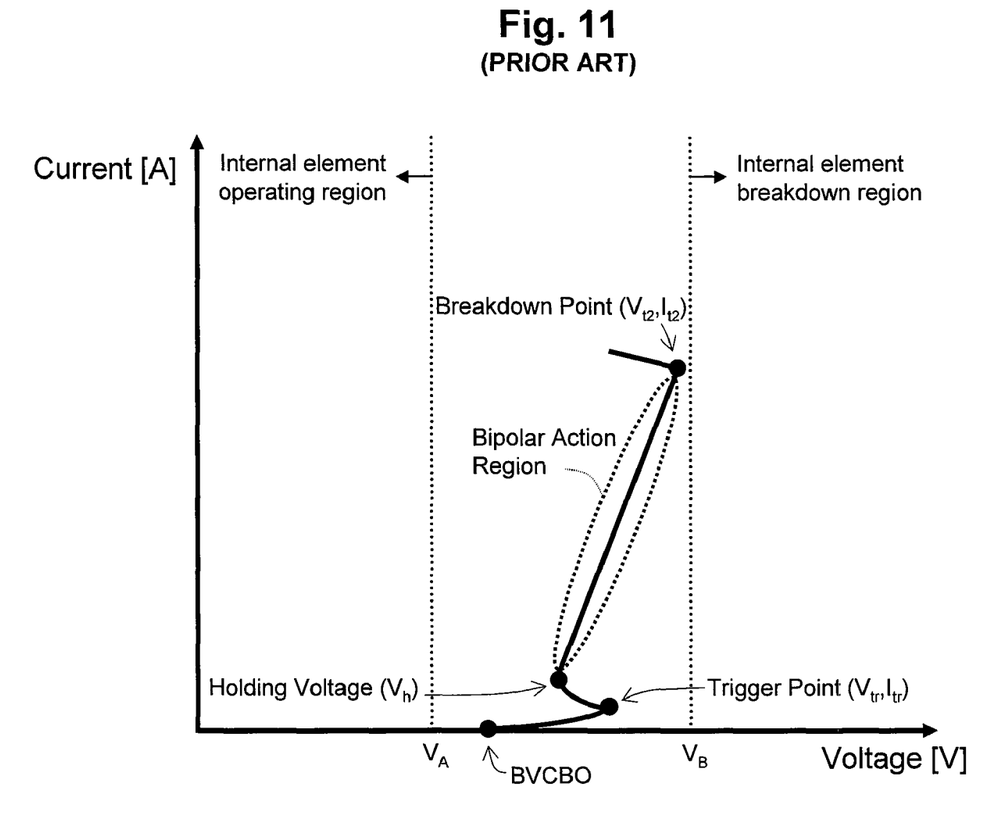
FIG. 11 is a current-voltage curve of a conventional electrostatic protection element.

Next, a phenomenon in a case of applying a plus surge to the semiconductor integrated circuit device provided with the NPN transistor for electrostatic protection having the above configuration from the I/O PAD 130 is explained with reference to FIGS. 10 and 11. FIG. 11 shows current-voltage characteristics of the NPN transistor for electrostatic protection shown in FIG. 10. In FIG. 11, the horizontal axis corresponds to a collector potential, and the vertical axis corresponds to a collector current.

When the plus surge is applied to the I/O PAD 130, due to a rise of the collector potential, avalanche breakdown occurs especially in a region with great curvature at a collector-base PN-junction composed of the P-type diffusion layer 105 and the $N^{--}$-type diffusion layer 103 (BVCBO in FIG. 11). When the breakdown occurs, current due to the breakdown flows into the P-type diffusion layer 105. The potential (base potential) of the P-type diffusion layer 105 rises by the current and resistance of the P-type diffusion layer 105 itself. Then, when the collector potential further rises due to the plus surge, the base potential reaches an on-voltage of the NPN transistor, and the NPN transistor starts a bipolar action (trigger point ($V_{tr}$, $I_{tr}$) in FIG. 11).

When the NPN transistor starts the bipolar action, a large amount of electrons are injected from the $N^{++}$-type diffusion layer 106 to the $N^{--}$-type diffusion layer 103. In the configuration shown in FIG. 10, because impurity concentration of the $N^{--}$-type diffusion layer 103 immediately under the $N^{++}$-type diffusion layer 106 is comparatively low, the electrons injected from the $N^{++}$-type diffusion layer 106 become excess in the $N^{--}$-type diffusion layer 103. In order to neutralize these excess electrons, holes are injected from the P-type diffusion layer 105. The N⁻⁻⁻-type diffusion layer 103 region immediately under the N⁺⁺-type diffusion layer 106 starts acting like a base due to the injection of the holes. At this time, since the N⁻⁻⁻-type diffusion layer 103 becomes not an N-type layer but a neutral region with regard to a carrier charge, effective resistance with regard to the current are decreased and the collector potential is lowered. The state is a state where the NPN transistor is saturated. As a result, the collector potential is decreased from the trigger voltage $V_{tr}$ to the holding voltage $V_h$, which is a value depending upon a grounded-emitter DC current gain (hereafter, simply referred to as a current gain $h_{FE}$) of the NPN transistor in the saturated state.

Further, at this time, the neutral region of the N⁻⁻⁻-type diffusion layer 103 reaches to the P-type semiconductor substrate 101, and a part of the P-type semiconductor substrate 101 is also operated as a base as similar to the N⁻⁻⁻-type diffusion layer 103 immediately under the N⁺⁺-type diffusion layer 106. Therefore, because an apparent base width becomes very wide, the current gain $h_{FE}$ becomes smaller, and the holding voltage $V_h$ is maintained at high. Such expansion of the base region occurs to a boundary between the P-type semiconductor substrate 101 and the N⁻⁻⁻-type diffusion layer 103 due to not forming an N-type buried diffusion layer with high impurity concentration in the NPN transistor for electrostatic protection.

Furthermore, when the holding voltage $V_h$ of the NPN transistor for electrostatic protection is lower than an operating upper limit voltage $V_A$ (voltage defined with maximum voltage for effectively operating the internal elements comprising the internal circuit 140 or maximum rating) of the internal circuit 140, input of instantaneous noises at the time of normally operating the semiconductor integrated circuit device shall cause the bipolar action of the NPN transistor for electrostatic protection. In this case, a signal to be entered from the I/O PAD 130 will not be entered into the internal circuit 140, and the semiconductor integrated circuit device cannot be normally operated. Further, when the NPN transistor for electrostatic protection is connected to the power supply terminal, the collector is fixed to the operating supply voltage of the internal circuit 140, and the NPN transistor for electrostatic protection breaks down by an excess supply current from a power source. Consequently, the holding voltage $V_h$ of the NPN transistor for electrostatic protection is required to be the operating upper limit voltage $V_A$ of the internal circuit 140 or greater.

After the collector potential is decreased to the holding voltage $V_h$, the collector potential continues to rise according to the collector resistance depending upon the collector N⁺-type diffusion layer 104 from the holding voltage $V_h$ to breakdown potential $V_{t2}$ in association with the increase in the collector current (bipolar action region shown in FIG. 1). In the configuration shown in FIG. 10, since the impurity concentration of the N⁺-type diffusion layer 104 in the collector region is high, the N⁺-type diffusion layer 104 continuously functions as a collector without becoming a base in the holes injected from the P-type diffusion layer 105. Then, after the breakdown voltage $V_{t2}$ is reached, heat generation within the NPN transistor causes thermal runaway and thermal destruction occurs (breakdown point ($V_{t2}$, $I_{t2}$) in FIG. 11).

In the NPN transistor with the motion described above, the breakdown voltage $V_{t2}$ is irreversible breakdown voltage $V_B$ of the internal elements constituting the internal circuit 140 or less, and since the holding voltage $V_h$ will never be the operating upper limit voltage $V_A$ or less, the NPN transistor can be used as the electrostatic protection element for protecting high breakdown voltage semiconductor element.

SUMMARY OF THE INVENTION

However, the N⁺-type diffusion layer 104 in the conventional art is formed throughout a comparatively deep position from the substrate surface. For example, in a manufacturing process for forming a semiconductor integrated circuit device having high breakdown voltage MOS (metal oxide semiconductor) elements and low breakdown voltage MOS elements on a same substrate, such deep high-concentration diffusion layer will not be used for forming both elements. Therefore, in order to realize the structure in the conventional art, for the purpose of forming the N⁺-type diffusion layer 104, an addition a process to form a diffusion layer using an exclusive photo mask is required, and there is a problem that process cost becomes higher.

Taking the circumstances into consideration, the objective of the present invention is to provide an electrostatic protection element that can protect high breakdown voltage semiconductor elements without adding any special process.

In order to solve the problem, the present invention has adopted technical means mentioned below. In other words, an electrostatic protection element relating to the present invention comprises a semiconductor substrate of a first conductivity type and a first impurity layer of a second conductivity type, which is a conductivity type opposite to the first conductivity type, provided in the semiconductor substrate. A second impurity layer of the first conductive type, which functions as a gate, is provided in the first impurity layer. A third impurity layer of the second conductive type, which functions as a cathode, is provided in the second impurity layer. Further, a fourth impurity layer of the second conductive type is provided in the first impurity layer spaced apart from the second impurity layer at a distance. The fourth impurity layer comprises a fifth impurity layer of the first conductive type, which functions as an anode, and a sixth impurity layer of the second conductive type. Then, in this electrostatic protection element, an impurity concentration of the fourth impurity layer is higher than that of the first impurity layer, and a bottom of the fourth impurity layer is deeper than that of the second impurity layer. In the present invention, the first conductivity type and the second conductivity type are opposite conductivity type from each other. In other words, when the first conductivity type is a P-type, the second conductivity type is an N-type, and when the first conductivity type is an N-type, the second conductivity type is a P-type.

Since this electrostatic protection element is equipped with the fifth impurity layer of the first conductivity type functioning as an anode, when an excess current flows into the fourth impurity layer of the second conductivity type, an opposite conductivity type carrier for neutralizing the excess carriers can be easily supplied from the fifth impurity layer. Consequently, it accelerates the fourth impurity layer to become a base, and the operating voltage of the electrostatic protection element can be at a breakdown voltage of internal elements or less. Further, since both the first conductivity type and the second conductivity type carriers function as current, current capacity is enhanced and an area of the protection element can be reduced.

In the electrostatic protection element, the impurity concentration of the fifth impurity layer is preferably higher than that of the fourth impurity layer.

Further, when the electrostatic protection element is incorporated into a semiconductor device having an input/output terminal, a power supply terminal and a circuit to be protected, the second impurity layer and the third impurity layer are commonly connected to the lowest potential of the semiconductor device, and it is preferably that the fifth impurity layer and the sixth impurity layer are commonly connected to both the input/output terminal and the circuit to be protected, or both the power supply terminal and the circuit to be protected. Further, in this configuration, the fifth impurity layer and the sixth impurity layer may be independently connected to the circuit to be protected, respectively.

In addition, when the electrostatic protection element is incorporated into a semiconductor device having a circuit to be protected including a high breakdown voltage semiconductor element provided in a well layer of the second conductivity type and a low breakdown voltage semiconductor element provided in a well layer of the second conductivity type, it is preferable that the well layer where the high breakdown voltage semiconductor element is provided and the first impurity layer have a same impurity profile, and the well layer where the low breakdown voltage semiconductor element is provided and the fourth impurity layer have a same impurity profile. Further, when the circuit to be protected includes a semiconductor element having a contact layer including a high-concentration impurity layer of the first conductivity type and a semiconductor element having a contact layer including a high-concentration impurity layer of the second conductivity type, it is preferable that the contact layer of the first conductivity type and the fifth impurity layer have a same impurity profile, and the contact layer of the second conductivity type, the third impurity layer and the sixth impurity layer have a same impurity profile. Herein, the impurity profile indicates an impurity concentration distribution of the impurity layer in a depth direction. Further, the same impurity profile includes substantially the same profile. In other words, the impurity profile of each impurity layer simultaneously-formed in the same impurity introduction process is the same.

Furthermore, the first impurity layer can be an epitaxial layer. Further, a bottom of the fourth impurity layer is preferably deeper than that of the first impurity layer or the same depth.

According to the present invention, an electrostatic protection element that can protect internal elements without forming an impurity layer using a special process as in the conventional art or without inserting a protective resistance to be connected to the internal elements, and whose area is smaller can be provided.

The foregoing and other objects, features, aspects and advantages of the present invention will become more apparent from the following detailed description of the present invention when taken in conjunction with the accompanying drawings.

DETAILED DESCRIPTION OF PREFERRED EMBODIMENTS

Hereafter, an electrostatic protection element in an embodiment relating to the present invention is explained with reference to drawings. In the embodiments below, the present invention is embodied by a case of forming a semiconductor integrated circuit device including the electrostatic protection element on a P-type semiconductor substrate. Furthermore, even when a conductivity type of each impurity region in the embodiment below is opposite, a similar effect can be obtained.

Figure 1:
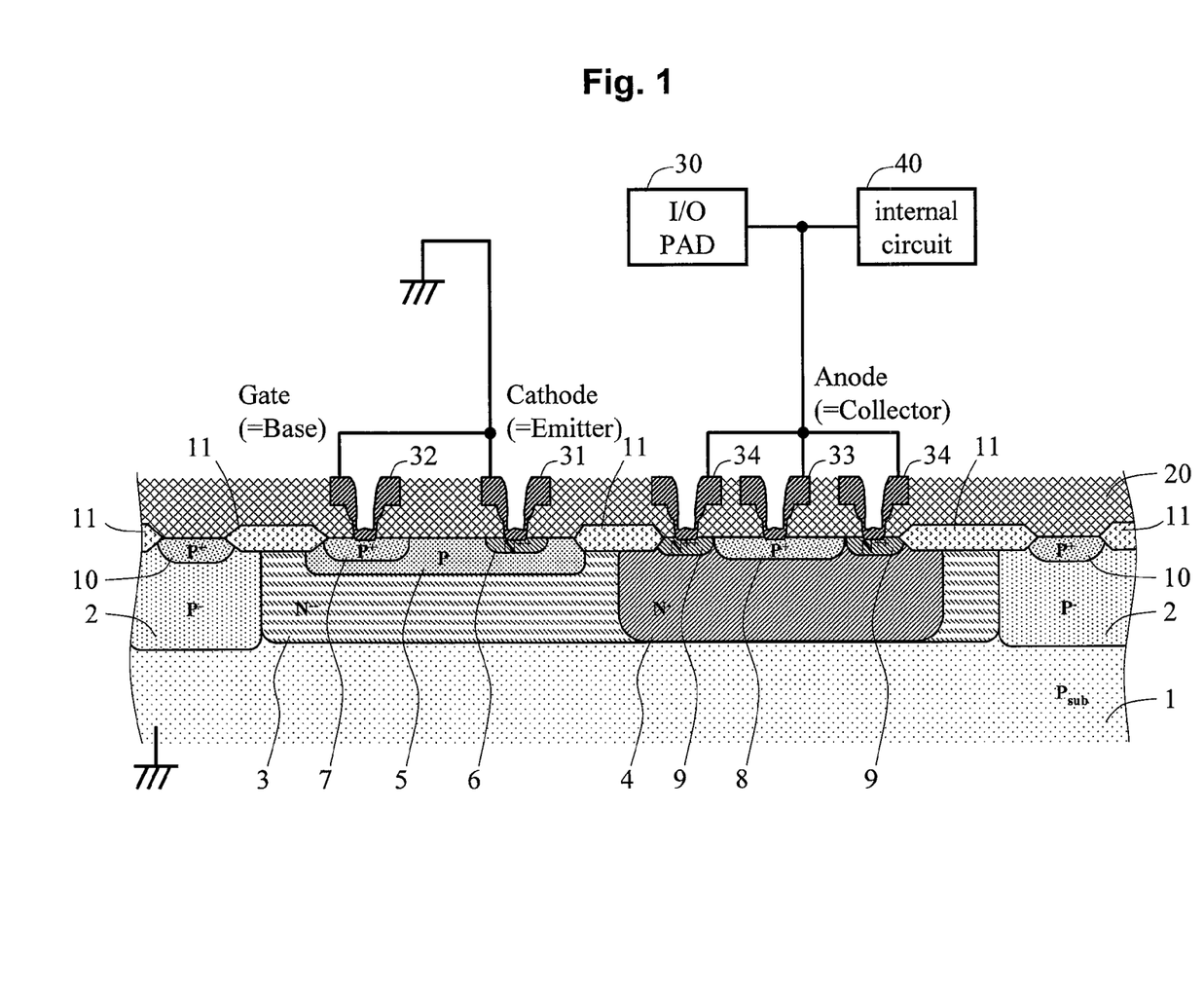
FIG. 1 is a cross sectional view showing a structure of an electrostatic protection element in one embodiment relating to the present invention.
Figure 2:
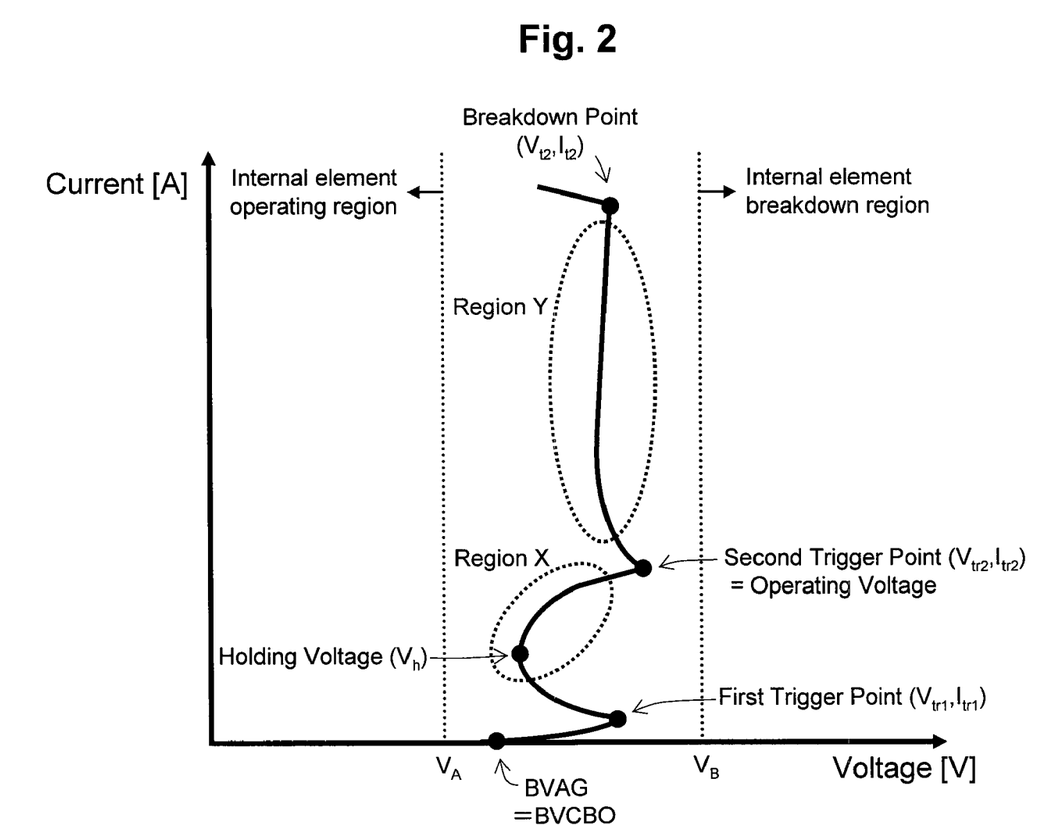
FIG. 2 is a current-voltage curve of an electrostatic protection element in one embodiment relating to the present invention.
Figure 3:
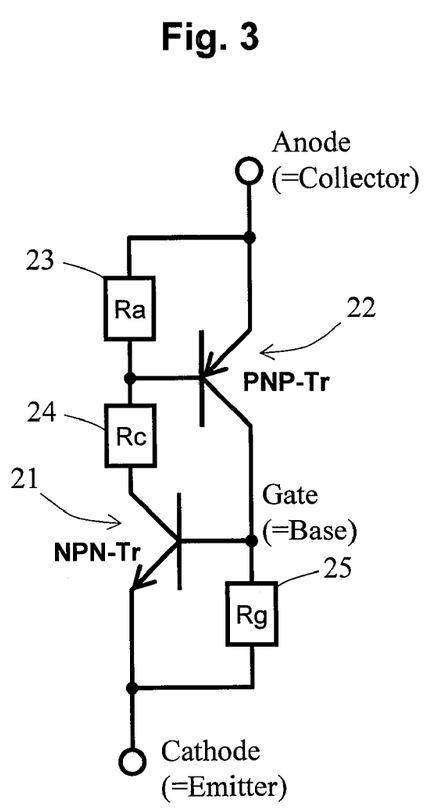
FIG. 3 is an equivalent circuit schematic of an electrostatic protection element in one embodiment relating to the present invention.
Figure 4:
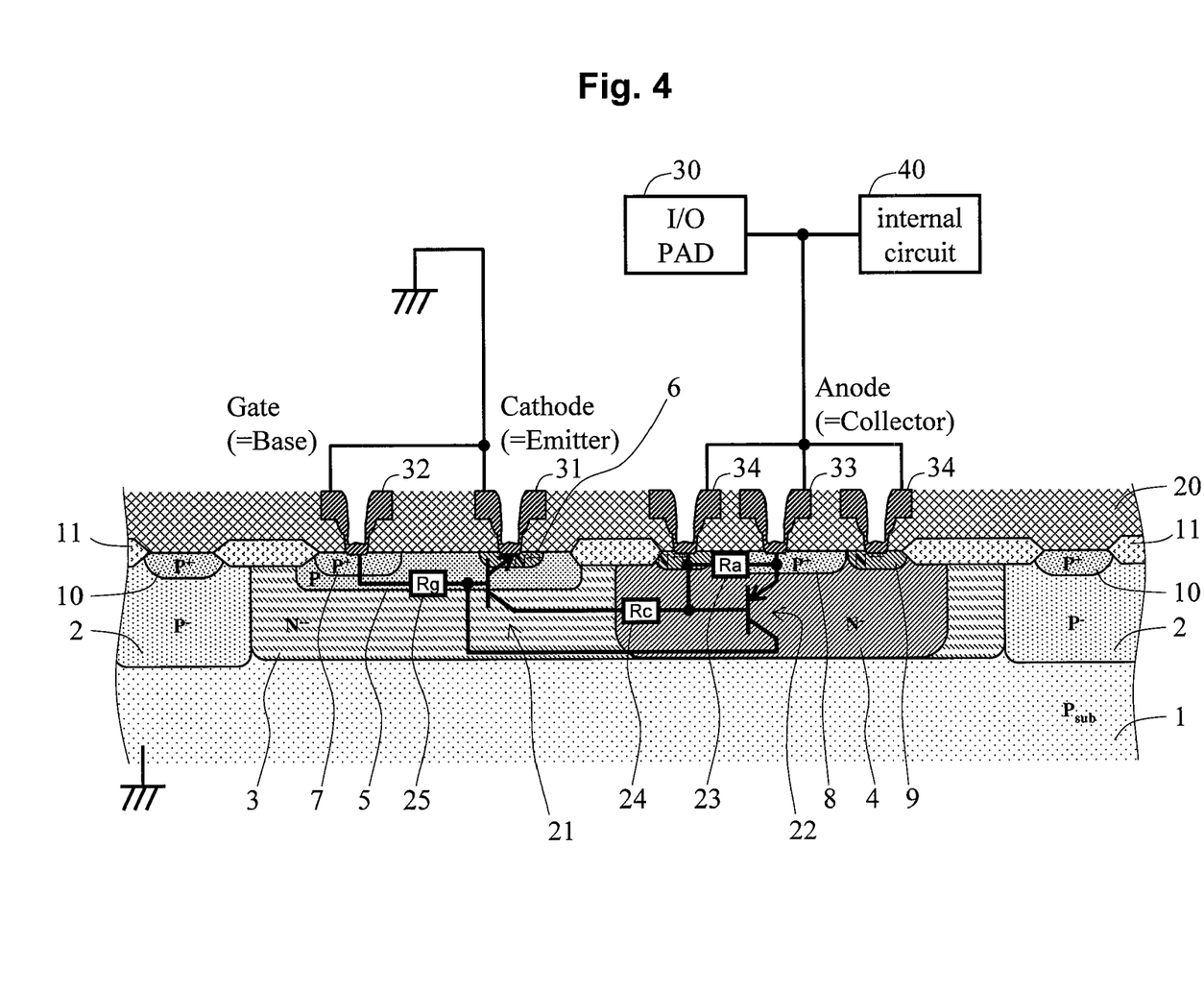
FIG. 4 is a cross sectional view showing the correspondence between the equivalent circuit and the structure of the electrostatic protection element in one embodiment relating to the present invention.
Figure 5:
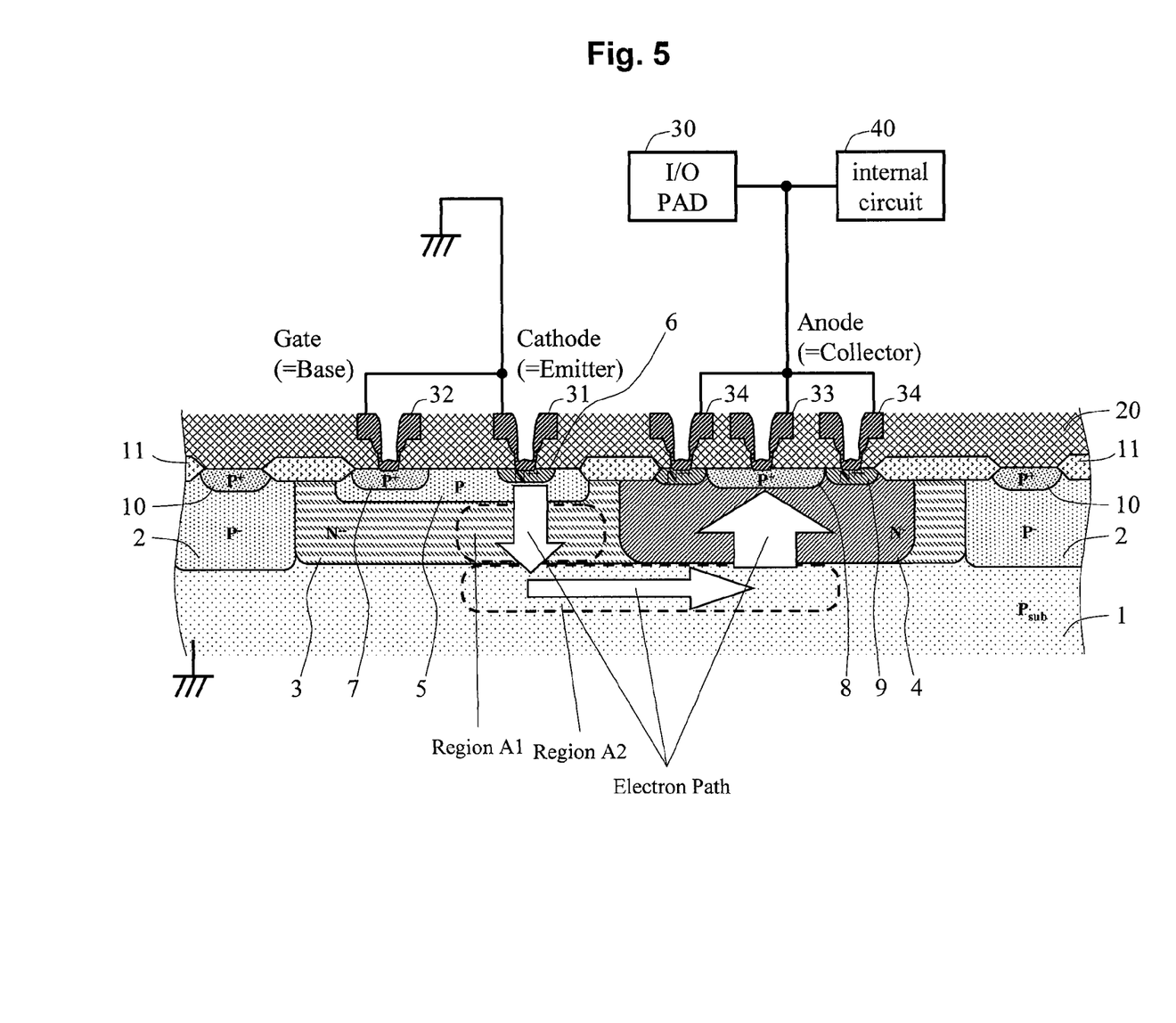
FIG. 5 is a cross sectional view explaining an operation of the electrostatic protection element in one embodiment relating to the present invention.
Figure 6:
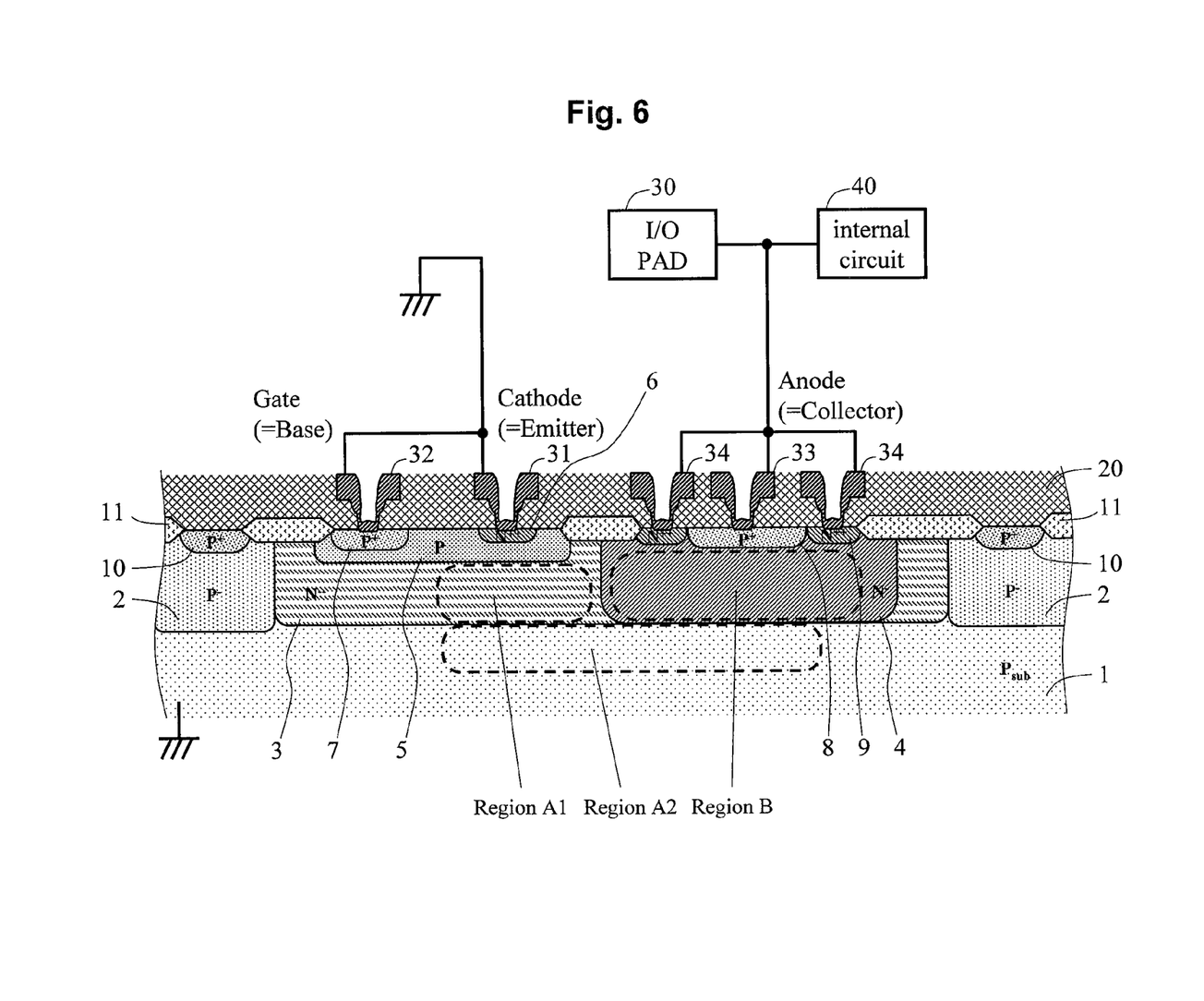
FIG. 6 is a cross sectional view explaining an operation of the electrostatic protection element in one embodiment relating to the present invention.

FIG. 1 is a cross sectional view showing an electrostatic protection element in one embodiment relating to the present invention, and FIG. 2 is a current-voltage curve explaining the operation of the electrostatic protection element. Further, FIG. 3 is an equivalent circuit schematic of the electrostatic protection element, and FIG. 4 shows the correspondence between the equivalent circuit and the cross-sectional structure. In addition, FIG. 5 and FIG. 6 are cross sectional views explaining the operation of the electrostatic protection element, respectively. Furthermore, as it is understood from FIG. 1, FIG. 3 and FIG. 4, the electrostatic protection element in this embodiment has a thyristor structure. Therefore, the electrostatic protection element in this embodiment is explained using component names that are unique to a thyristor below. Further, as described below, since the electrostatic protection element in this embodiment is similarly operated to an NPN transistor until becoming an on-state, component names that are unique to an NPN transistor are written down with the component names that are unique to a thyristor in FIG. 1 and FIGS. 4 to 6.

As shown in FIG. 1, the electrostatic protection element in this embodiment comprises a first impurity layer 3 (hereafter, referred to as the $N^{--}$-type impurity layer 3) composed of an N-type low-concentration impurity region formed in a surface portion of a P-type semiconductor substrate 1 made of single-crystal silicon. A second impurity layer 5 (hereafter, referred to as the P-type impurity layer 5), which functions as a gate of the thyristor and is composed of a P-type impurity region, is formed in a surface portion of the $N^{--}$-type impurity layer 3. A third impurity layer 6 (hereafter, referred to as the $N^{++}$-type impurity layer 6), which functions as a cathode of the thyristor and is composed of an N-type high-concentration impurity region, is formed in a surface portion of the P-type impurity layer 5. Further, an impurity layer 7 (hereafter, referred to as the $P^+$-type impurity layer 7), which is spaced apart from the $N^{++}$-type impurity layer 6 and is composed of a P-type high-concentration impurity region, is formed in a surface portion of the P-type impurity layer 5. The P+-type impurity layer 7 functions as a contact layer to realize ohmic contact between the P-type impurity layer 5 and a metal electrode mentioned below.

A fourth impurity layer 4 (hereafter, referred to as the N−-type impurity layer 4) composed of an N-type low-concentration impurity region is formed in the N−−−-type impurity layer 3 spaced apart from the P-type impurity layer 5 at a predetermined distance laterally (in a direction along the substrate surface). The N−-type impurity layer 4 has higher impurity concentration than the N−−−-type impurity layer 3, and the bottom of the N−-type impurity layer 4 (junction depth) is deeper than that of the P-type impurity layer 5. A fifth impurity layer 8 (hereafter, referred to as the P+-type impurity layer 8), which functioning as an anode of the thyristor and is composed of a P-type high-concentration impurity region, is formed in a surface portion of the N−-type impurity layer 4. Further, a sixth impurity layer 9 (hereafter, referred to as the N++-type impurity layer 9) composed of an N-type high-concentration impurity region is formed in a surface portion of the N−-type impurity layer 4, the surface portion being different from the formation region of the P+-type impurity layer 8. The N++-type impurity layer 9 functions as a contact layer to realize ohmic contact between the N−-type impurity layer 4 and a metal electrode mentioned below. In this configuration, the P+-type impurity layer 8 and the N++-type impurity layer 9 are adjacently formed.

Further, a P-type separating layer is disposed around a periphery of the N−−−-type impurity layer 3. In this embodiment, the P-type separating layer is composed of an impurity layer 2 (hereafter, referred to as the P−-type impurity layer 2) consisting of a P-type low-concentration impurity region and an impurity layer 10 (hereafter referred to as the P+-type impurity layer 10) consisting of a P-type high-concentration impurity region formed in a surface portion of the P−-type impurity layer 2. Further, metal electrodes 31, 32, 33 and 34 making ohmic contact with each impurity layer are placed on the N++-type impurity layer 6, the P+-type impurity layer 7, the P+-type impurity layer 8 and the N++-type impurity layer 9, respectively. The metal electrodes 31 to 34 are placed within through-holes formed in an interlayer insulating film 20 formed on the P-type semiconductor substrate 1. In addition, an element separating insulating film 11 is formed on the surface of the P-type semiconductor substrate 1, and in the example of FIG. 1, the P-type impurity layer 5, the P+-type impurity layer 7, the P+-type impurity layer 8 and the N++-type impurity layer 9 are exposed within openings formed in the element separating insulating film 11.

Furthermore, no buried impurity layer composed of an N-type high-concentration impurity region is formed in the electrostatic protection element of this embodiment, and the N−−−-type impurity layer 3 is formed in a state to make contact with the P-type semiconductor substrate 1. Further, another wiring layer and another interlayer insulating film are formed on the interlayer insulating film 20 as upper layers. However, since this does not directly pertain to the present invention, an explanation in this embodiment and an illustration in FIG. 1 are omitted.

In the electrostatic protection element having the above configuration in this embodiment, the N++-type impurity layer 6 and the N++-type impurity layer 9 can be simultaneously formed in a same impurity introduction process. Further, the P+-type impurity layer 7, the P+-type impurity layer 8 and the P+-type impurity layer 10 can also be formed simultaneously in a same impurity introduction process.

Particularly, when the electrostatic protection element is incorporated into a semiconductor integrated circuit device containing a high breakdown voltage MOS element and a low breakdown voltage MOS element, the N−−−-type impurity layer 3, the N−-type impurity layer 4, the N++-type impurity layer 6, the N++-type impurity layer 9, the N+-type impurity layer 7, the N+-type impurity layer 8 and the N+-type impurity layer 10 can be formed as mentioned below. Furthermore, the high breakdown voltage MOS element is a MOS element, such as a MOS type transistor, having comparatively high element breakdown voltage (for example, 20 V or greater) to be used for an output circuit outputting a drive signal in a semiconductor integrated circuit device for driving an LCD (Liquid Crystal Display) panel and the like. Further, the low breakdown voltage MOS element is a MOS element, such as a MOS type transistor, having comparatively low breakdown voltage (for example, less than 10 V) to be used for a logic circuit (CMOS circuit) for controlling the operation of the output circuit in a semiconductor integrated circuit device for driving an LCD (Liquid Crystal Display) panel and the like.

In this case, the N−−−-type impurity layer 3 can be formed simultaneously with an N-type well layer for the high breakdown voltage MOS element in a same impurity introduction process. Further, the N−-type impurity layer 4 can be formed simultaneously with an N-type well layer for the low breakdown voltage MOS element in a same impurity introduction process. The P-type impurity layer 5 can be formed simultaneously with a body layer for the high breakdown voltage MOS element to be formed by double diffusion in a same impurity introduction process. In addition, the N++-type impurity layer 6 and the N++-type impurity layer 9 can be formed simultaneously in an impurity introduction process to form a high-concentration impurity layer located in a source layer and a drain layer of an N-channel MOS element, and the P+-type impurity layer 7, the P+-type impurity layer 8 and the P+-type impurity layer 10 can be formed simultaneously in an impurity introduction process to form a high-concentration impurity layer located in a source layer and a drain layer of a P-channel MOS element. Therefore, for the electrostatic protection element of this embodiment, it is unnecessary to add any special process to form the N−-type impurity layer 4, and it is possible to manufacture this N−-type impurity layer 4 in a series of manufacturing processes to form the high breakdown voltage MOS element and the low breakdown voltage MOS element. Furthermore, the MOS elements are exemplified as the high breakdown voltage semiconductor element and the low breakdown voltage semiconductor element; however, they are not necessarily the MOS elements but bipolar elements as long as they are a high breakdown voltage semiconductor element formed within a well layer for a high breakdown voltage element and a low breakdown voltage semiconductor element formed within a well layer for a low breakdown voltage element.

An impurity concentration of each impurity layer in the electrostatic protection element can be set, for example, as follows: the impurity concentration of the P-type semiconductor substrate 1 is approximately $1.0 \times 10^{15}/cm^3$; the impurity concentration of the N−−−-type impurity layer 3 is from approximately $1.0 \times 10^{15}/cm^3$ to approximately $3.0 \times 10^{16}/cm^3$; the impurity concentration of the P-type impurity layer 5 is from approximately $1.0 \times 10^{17}/cm^3$ to approximately $2.0 \times 10^{18}/cm^3$; the impurity concentration of the N++-type impurity layer 6 is from approximately $5.0 \times 10^{18}/cm^3$ to approximately $5.0 \times 10^{20}/cm^3$; the impurity concentration of the N−-type impurity layer 4 is higher concentration than the N−−−-type impurity layer 3 and from approximately $2.0 \times 10^{15}/cm^3$ to approximately $1.0 \times 10^{17}/cm^3$; the impurity concentration of the P+-type impurity layer 7 is from approximately $1.0 \times 10^{19}/cm^3$ to approximately $5.0 \times 10^{20}/cm^3$; the impurity concentration of the P+-type impurity layer 8 is from approximately $1.0\times10^{19}/cm^3$ to approximately $5.0\times10^{20}/cm^3$; and the impurity concentration of the $N^{++}$-type impurity layer 9 is from approximately $1.0\times10^{19}/cm^3$ to approximately $5.0\times10^{20}/cm^3$. Further, the concentration of the P-type separating layer composed of the $P^-$-type impurity layer 2 and the $P^+$-type impurity layer 10 should be approximately $1.0\times10^{16}/cm^3$ or greater.

As described above, the electrostatic protection element has a thyristor structure. Therefore, the structure shown in FIG. 1 is equivalent to a circuit where an NPN transistor 21 and a PNP transistor 22 are combined as shown in FIG. 3. In other words, as shown in FIG. 4, in the NPN transistor 21 composed of the $N^{++}$-type impurity layer 6, the P-type impurity layer 5, the $N^{---}$-type impurity layer 3 and the $N^-$-type impurity layer 4, and the PNP transistor 22 composed of the P-type impurity layer 5, the $N^{---}$-type impurity layer 3, the $N^-$-type impurity layer 4 and the $P^+$-type impurity layer 8, the $N^{++}$-type impurity layer 6 and the P-type impurity layer 5 are short-circuited via the $P^+$-type impurity layer 7, and the $P^+$-type impurity layer 8 and the $N^-$-type impurity layer 4 are short-circuited via the $N^{++}$-type impurity layer 9.

When the electrostatic protection element having the structure is incorporated into the semiconductor integrated circuit device, the metal electrode 32 connected to the P-type impurity layer 5 that functions as a gate via the $P^+$-type impurity layer 7 and the metal electrode 31 connected to the $N^{++}$-type impurity layer 6 that functions as a cathode are commonly connected to the lowest potential, such as GND (ground potential), by an aluminum wire. Further, the metal electrode 33 connected to the $P^+$-type impurity layer 8 that functions as an anode and the metal electrode 34 connected to the $N^-$-type impurity layer 4 via the $N^{++}$-type impurity layer 9 are commonly connected by an aluminum wire, and are further connected both to an Input/Output terminal 30 (hereafter, referred to as the I/O PAD 30) formed on the semiconductor substrate 1 and the Input/Output part of the internal circuit 40. Herein, the internal circuit 40 is a circuit to be protected composed of the internal elements, such as the high breakdown voltage MOS elements and the low breakdown voltage MOS elements, and realizes the function of the semiconductor integrated circuit device. Furthermore, the metal electrode 33 and the metal electrode 34 may be mutually connected to each other by an aluminum wire, and then, they may be connected to both a power supply terminal formed on the semiconductor substrate 1 and a power-input part of the internal circuit 40 by an aluminum wire instead of the above connection. Further, the metal electrode 33 and the metal electrode 34 may be connected separately to the internal circuit 40 without being directly connected to each other by the aluminum wire.

Next, an operation of the electrostatic protection element having the structure is explained using FIGS. 2 to 4. In FIG. 2, the horizontal axis corresponds to the anode potential, and the vertical axis corresponds to the anode current.

When a plus surge is applied to the I/O PAD 30, due to a rise of the anode potential, avalanche breakdown occurs in a region with great curvature at an anode-gate PN junction composed of the P-type impurity layer 5 and the $N^{---}$-type impurity layer 3 (BVAG in FIG. 2). When the breakdown occurs, current (anode current) due to the breakdown flows into the $P^+$-type impurity layer 7 via the PN junction composed of the P-type impurity layer 5 and the $N^{---}$-type impurity layer 3. The potential of the P-type impurity layer 5 (gate) adjacent to the $N^{++}$-type impurity layer 6 (cathode) is increased by the current and resistance of the P-type impurity layer 5 itself.

After the breakdown occurrence, when the anode potential further rises by the plus surge, potential at the portion adjacent to the $N^{++}$-type impurity layer 6 of the P-type impurity layer 5 rises to an on-voltage of the PN junction composed of the P-type impurity layer 5 and the $N^{++}$-type impurity layer 6, and the electrostatic protection element starts a bipolar action (a first trigger point ($V_{tr1}$, $I_{tr1}$) in FIG. 2). In other words, the NPN transistor 21 becomes in the on-state by the current flowing in a gate internal resistance 25 shown in FIGS. 3 and 4. In this structure, since the $P^+$-type impurity layer 8 and the $N^{++}$-type impurity layer 9 are short-circuited, the electrostatic protection element operates as the NPN transistor 21 using the $N^{++}$-type impurity layer 9, the $N^-$-type impurity layer 4 and the $N^{---}$-type impurity layer 3 as a collector, the P-type impurity layer 5 as a base and the $N^{++}$-type impurity layer 6 as an emitter until greater current flows into the P-type impurity layer 5 and then the PNP transistor 22 becomes in the on-state as described later.

The state where the NPN transistor 21 starts the bipolar action and the anode current is drastically increased is explained especially with reference to FIG. 5. In this state, electrons are injected into the $N^{---}$-type impurity layer 3 from the $N^{++}$-type impurity layer 6 via the P-type impurity layer 5. At this time, because the N-type impurity concentration is comparatively low in the $N^{---}$-type impurity layer 3 immediately under the $N^{++}$-type impurity layer 6 (a region A1 shown in FIG. 5), the injected electrons become excess. In order to neutralize these excess electrons, holes are injected from the P-type impurity layer 5, and the $N^{---}$-type impurity layer 3 immediately under the $N^{++}$-type impurity layer 6 (region A1) starts acting like a base of the NPN transistor 21. At this time, the $N^{---}$-type impurity layer 3 immediately under the $N^{++}$-type impurity layer 6 (region A1) becomes not an N-type region but a neutral region with regard to carrier charges. Consequently, an effective resistance with regard to the current flowing into the $N^{---}$-type impurity layer 3 is decreased, and the anode potential is decreased to potential corresponding to the resistance of the $N^-$-type impurity layer 4 and the $N^{++}$-type impurity layer 9. As a result, the anode potential is decreased to a holding voltage $V_h$, which is a value depending upon a grounded-emitter DC current gain $h_{FE}$ (hereafter, referred to as a current gain $h_{FE}$) of the NPN transistor 21 in the state from the voltage $V_{tr1}$ at the first trigger point (see FIG. 2).

Further, when the neutral region reaches to the P-type semiconductor substrate 1, a part of the P-type semiconductor substrate 1 becomes similarly operated as a base of the NPN transistor 21 (a region A2 in FIG. 5). Therefore, an apparent base width of the NPN transistor 21 becomes very wider, and the current gain $h_{FE}$ of the NPN transistor 21 becomes smaller. In other words, an apparent resistance from the cathode to the anode becomes greater and the holding voltage $V_h$ is maintained at high.

Furthermore, in this structure, the impurity concentration of the $N^-$-type impurity layer 4 is higher than that of the $N^{---}$-type impurity layer 3, and the bottom of the $N^-$-type impurity layer 4 (junction depth) is deeper than that of the P-type impurity layer 5. Consequently, as shown in FIG. 5, electrons flow from the $N^{++}$-type impurity layer 6 toward the P-type semiconductor substrate 1 once in the vertical direction, and then, flow into the anode side through the $N^-$-type impurity layer 4 (an arrow indicated in FIG. 5). Supposedly, if the impurity concentration of the $N^-$-type impurity layer 4 is low, which is the same level as that of the $N^{---}$-type impurity layer 3, the electrons flow in a topmost surfaces of the $N^{---}$-type impurity layer 3 and the $N^-$-type impurity layer 4 without flowing into a region so as to reach to the P-type semiconductor substrate 1 because the N⁻-type impurity layer 4 becomes a base simultaneously with the N⁻⁻⁻-type impurity layer 3. As such case, when the current flows in the topmost surfaces of the N⁻⁻⁻-type impurity layer 3 and the N⁻-type impurity layer 4, the current shall be concentrated at the P-type impurity layer 5 side of the N⁺⁺-type impurity layer 9 positioned at the P-type impurity layer 5 side, and it causes irreversible breakdown.

After the NPN transistor 21 starts the bipolar action, when the anode potential is further increased by the plus surge, the anode current is increased in accordance with the resistance (a collector internal resistance 24 shown in FIGS. 3 and 4) of the N⁻-type impurity layer 4 (the region X in FIG. 2). At this time, when a certain current or greater flows into the N⁻-type impurity layer 4, the electrons within the N⁻-type impurity layer 4 whose N-type impurity concentration is comparatively low become excess. When the electrons that are injected from the N⁺⁺-type impurity layer 6 and are entered into the N⁻type impurity layer 4 become excess, holes are injected into the N⁻-type impurity layer 4 from the P⁺-type impurity layer 8 (anode) in order to neutralize these excess electrons. This causes an acceleration of the N⁻-type impurity layer 4 to be a base. In other words, since the impurity concentration of the P⁺-type impurity layer 8 is higher than that of the P-type semiconductor substrate 1, the region of the N⁻-type impurity layer 4 becomes a base in a shorter time compared to a case where the holes are injected only from the P-type semiconductor substrate 1. Due to becoming a base, the N⁻-type impurity layer 4 also acts like as a base of the NPN transistor 21. At this time, because the region of the N⁻-type impurity layer 4 becomes not an N-type region but a neutral region by the injected holes, a resistance of the region is decreased. Therefore, the anode potential is decreased. In FIG. 2, a second trigger point ($V_{tr2}$, $I_{tr2}$) is a point when the decrease in this anode potential is started, and FIG. 6 shows a state where the region of the N⁻-type impurity layer 4 becomes a base, and the region B shown in FIG. 6 is the N⁻-type impurity layer 4 that has become a base.

When the anode potential further rises due to the plus surge and the anode current further flows, the potential of the N⁻-type impurity layer 4 reaches to the voltage where the PNP transistor 22 becomes in the on-state due to the current flowing into a resistance (an anode internal resistance 23 shown in FIGS. 3 and 4) existing from a contact portion between the P⁺⁺-type impurity layer 9 and the metal electrode 34 to a contact portion between the P⁺-type impurity layer 8 and the metal electrode 33. When the PNP transistor 22 is the on-state, the thyristor composed of the NPN transistor 21 and the PNP transistor 22 becomes the on-state. When the thyristor becomes in the on-state, the anode voltage and the anode current are increased (region Y in FIG. 2) in accordance with an on-resistance of the thyristor. Then, after the breakdown voltage $V_{t2}$ is reached, heat generation within he electrostatic protection element causes thermal runaway and thermal destruction occurs (breakdown point ($V_{t2}$, $I_{t2}$) in FIG. 2).

Figure 7:
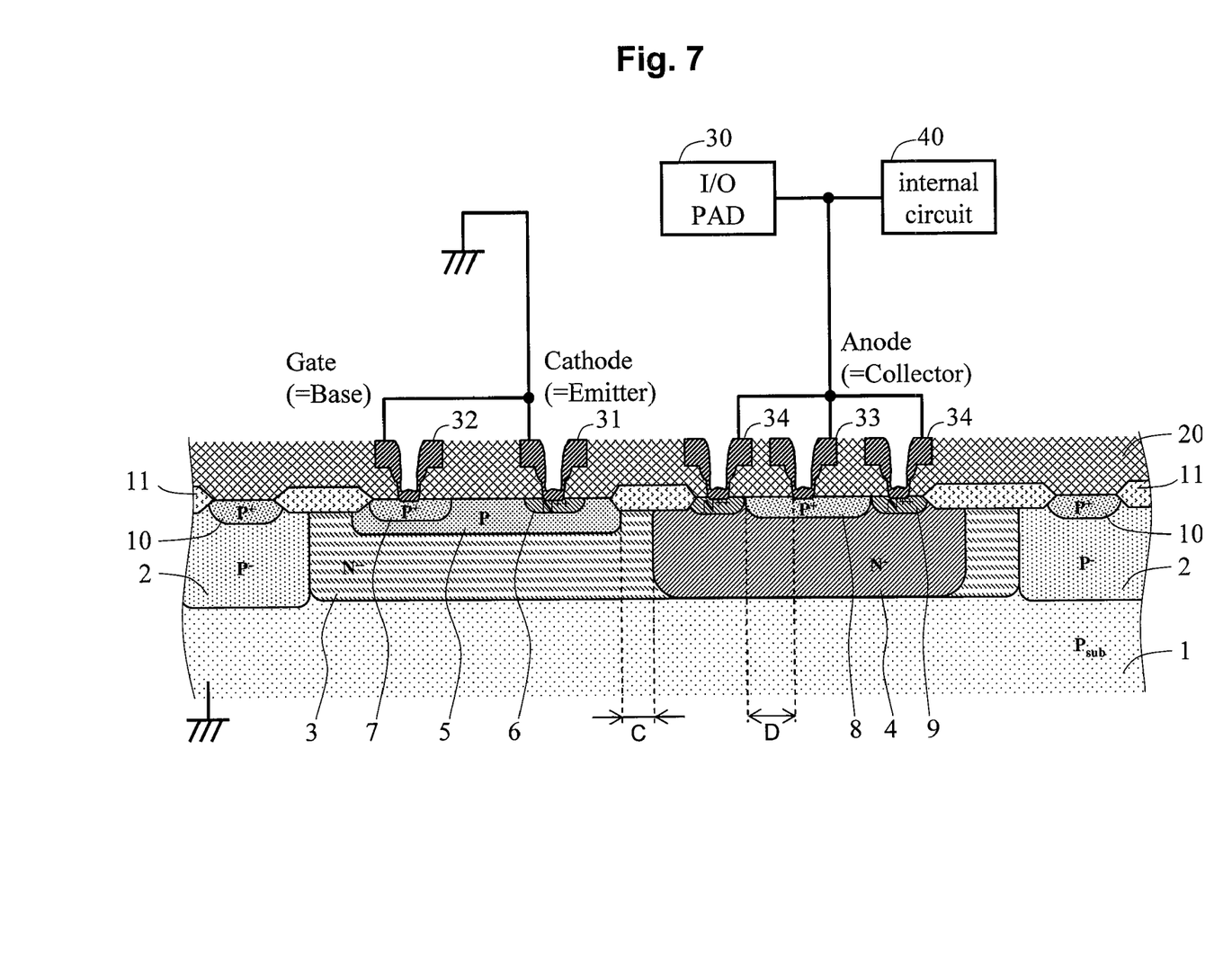
FIG. 7 is a cross sectional view explaining characteristic adjustment of the electrostatic protection element in one embodiment relating to the present invention.

In order for the electrostatic protection element in this embodiment as described above to function as an electrostatic protection element to the semiconductor integrated circuit device, the holding voltage $V_h$ needs to be the operating upper limit voltage $V_A$ or greater of the internal circuit 40 in the semiconductor integrated circuit device, and, the operating voltage (the voltage $V_{tr2}$ at the second trigger point) needs to be the irreversible breakdown voltage $V_B$ or less of the internal elements comprising the internal circuit 40. FIG. 7 is a cross sectional view for explaining a relationship the structure of the electrostatic protection element and, the breakdown voltage BVAG, the voltage $V_{tr1}$ at the first trigger point, the holding voltage $V_h$ and the operating voltage $V_{tr2}$ in this embodiment.

As shown in FIG. 7, the holding voltage $V_h$ and the operating voltage $V_{tr2}$ of the electrostatic protection element in this embodiment can be set according to a shortest distance C from an edge of the P-type impurity layer 5 to an edge of the N⁻-type impurity layer 4 and a shortest distance D from an edge of the contact portion between the P⁺-type impurity layer 7 and the metal electrode 33 to an edge of the N⁺⁺-type impurity layer 9. In other words, during the operation of the electrostatic protection element, a depletion layer width expanding at the N⁻-type impurity layer 4 side of the PN junction composed of the P-type impurity layer 5 and the N⁻⁻⁻-type impurity layer 3 varies according to the distance C. For example, when the distance C becomes longer, the breakdown voltage between the P-type impurity layer 5 and the N⁻-type impurity layer 4 becomes greater. In this case, the breakdown voltage BVAG and the voltage $V_{tr1}$ at the first trigger point shown in FIG. 2 shift toward the higher voltage side. Therefore, the breakdown voltage BVAG and the voltage $V_{tr1}$ at the first trigger point can be adjusted by changing the distance C.

Further, the anode internal resistance 23 varies according to the distance D. For example, when the distance D becomes longer, the resistance of the P⁺-type impurity layer 8 (equivalent to the anode internal resistance 23 in FIG. 3) becomes greater. In this case, during the operation of the electrostatic protection element, voltage drop from the contact portion between the P⁺-type impurity layer 8 and the metal electrode 33 to a junction edge of the P⁺-type impurity layer 8 (PN junction composed of the P⁺-type impurity layer 8 and the N⁺⁺-type impurity layer 9) becomes greater, and the thyristor can become the on-state in an earlier stage. In other words, the N⁻-type impurity layer 4 can be filled with holes sooner and the voltage $V_{tr2}$ (operating voltage) at the second trigger point can be lowered.

Figure 8:
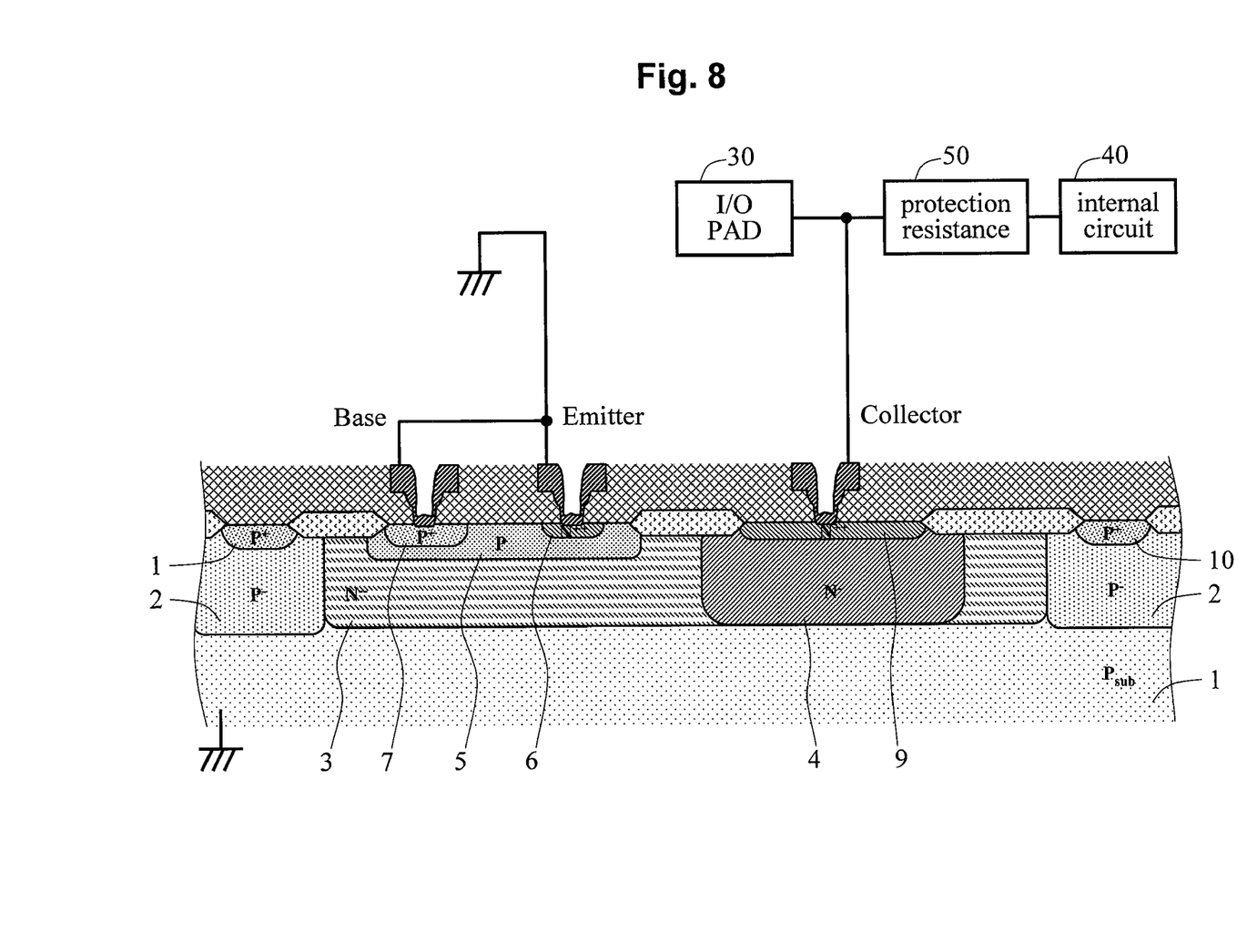
FIG. 8 is a cross sectional view showing an electrostatic protection element in a comparative example relating to the present invention.
Figure 9:
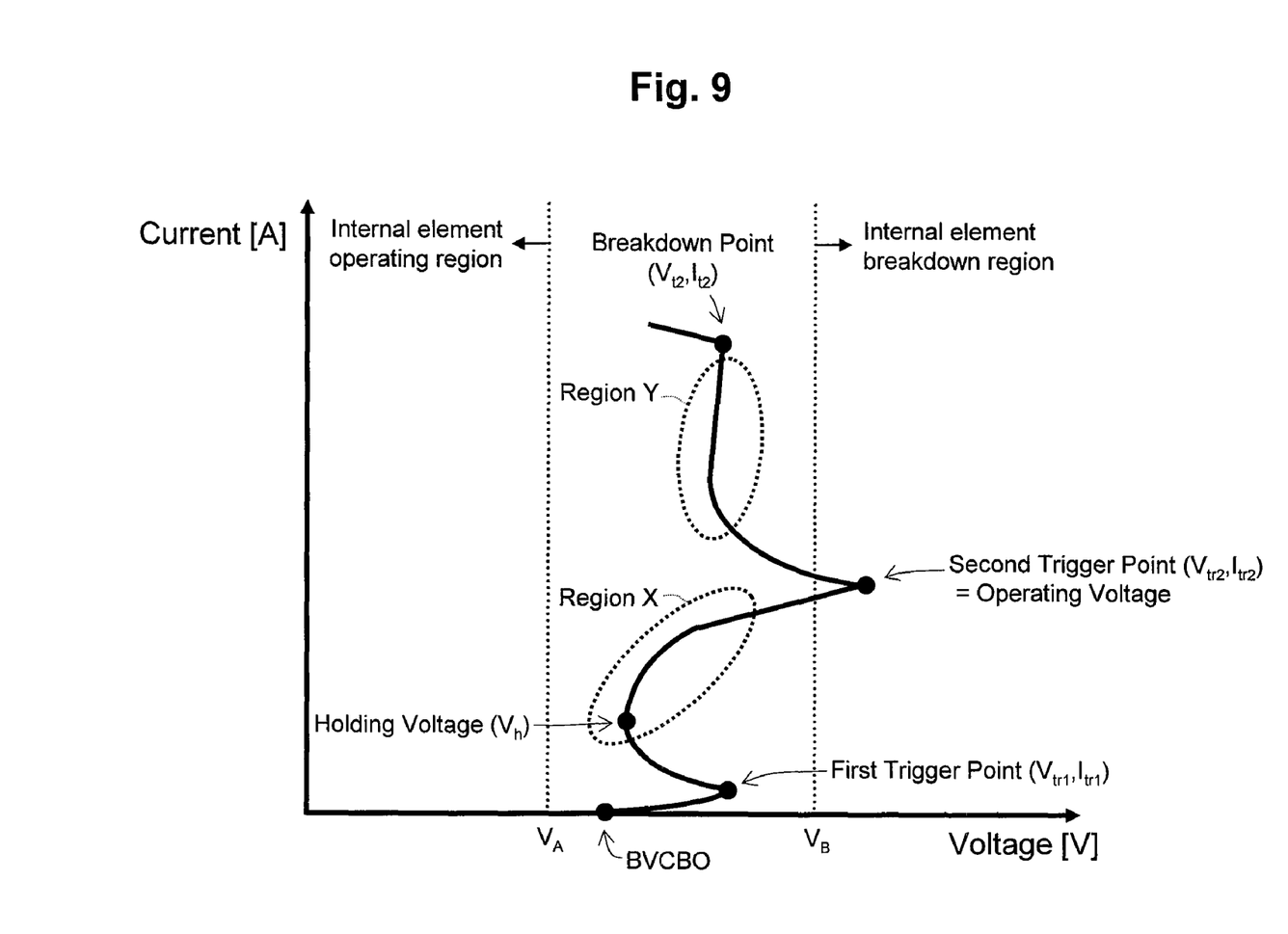
FIG. 9 is a current-voltage curve of an electrostatic protection element in a comparative example relating to the present invention.

Subsequently, an effect of the P⁺-type impurity layer 8 located in the electrostatic protection element in this embodiment is explained in further detail with reference to a comparative example. FIG. 8 is a cross sectional view showing a structure of an electrostatic protection element (hereafter, referred to as the comparative example) where the P⁺-type impurity layer 8 forming an anode is removed from the electrostatic protection element in this embodiment. Further, FIG. 9 is a current-voltage curve of this comparative example. In this comparative example, the N⁻-type impurity layer 4 has the impurity concentration which is the same level as that of the N-type well region of the low breakdown voltage P-channel MOS transistor to be formed on the semiconductor substrate as the internal circuit 40. Also, since the P⁺-type impurity layer 8, which is equipped in the electrostatic protection element relating to the present invention, is not included, this comparative example can be regarded as an NPN transistor. Consequently, hereafter, the comparative example is explained using component names that are unique to an NPN transistor.

When a plus surge is applied to the I/O PAD 30 in the comparative example shown in FIG. 8, due to a rise of the collector potential, avalanche breakdown occurs to a collector-base PN junction between composed of the P-type impurity layer 5 and the N⁻⁻⁻-type impurity layer 3 (BVCBO in FIG. 9). When the breakdown occurs, current flows into the P-type impurity layer 5, and the potential (base potential) in the P-type impurity layer 5 in a vicinity of the PN junction composed of the N⁺⁺-type impurity layer 6 function as an emitter and the P-type layer 5 is increased. When the potential of the P-type impurity layer 5 is increased to the on-voltage of the NPN transistor, the NPN transistor starts the bipolar action (first trigger point ($V_{tr1}$, $I_{tr1}$)).

When the NPN transistor started the bipolar action and the current is further increased by the plus surge, electrons injected into the $N^{---}$-type impurity layer 3 from the $N^{++}$-type impurity layer 6 via the P-type impurity layer 5 become excess within the $N^{---}$-type impurity layer 3. In order to neutralize these excess electrons, holes are injected into the $N^{---}$-type impurity layer 3 from the P-type impurity layer 5. Then, the $N^{---}$-type impurity layer 3 immediately under the $N^{++}$-type impurity layer 6 starts acting like a base of the NPN transistor. At this time, the $N^{---}$-type impurity layer 3 becomes not an N-type region but a neutral region with regard to carrier charges and effective resistance in the region are decreased. Then, the potential of the $N^{++}$-type impurity layer 9 (collector potential) is decreased. As a result, the collector potential is reduced from the potential $V_{tr1}$ at the first trigger point to the holding voltage $V_h$ between the collector and the emitter, which is a value depending upon the grounded-emitter DC current gain $h_{FE}$ of the NPN transistor under this condition. The neutral region of the $N^{---}$-type impurity layer 3 reaches to the P-type semiconductor substrate 1, and a surface portion of the P-type semiconductor substrate 1 also acts as a base. As described above, because an apparent base width becomes very wider, the current gain $h_{FE}$ of the NPN transistor becomes further smaller, and the collector voltage is maintained at comparatively high voltage as the holding voltage $V_h$ is a minimum value (region X in FIG. 9).

After this, the current further flows in accordance with a resistance of the $N^-$-type impurity layer 4, and when the second trigger point ($V_{tr2}$, $I_{tr2}$) is reached, in order to neutralize excess electrons injected into the $N^-$-type impurity layer 4 under the $N^{++}$-type impurity layer 9, which is a collector contact, holes are injected into the $N^-$-type impurity layer 4 from the P-type semiconductor substrate 1. This causes the $N^-$-type impurity layer 4 in this portion to function as a base, as well. At this time, the region of the $N^-$-type impurity layer 4 becomes not an N-type region but a neutral region, the collector resistance is decreased and the collector potential is reduced (region Y in FIG. 9). The voltage $V_{tr2}$ at the second trigger point (operating voltage) is mainly determined with the current flowing into the low-concentration $N^-$-type impurity layer 4 and a resistance of the low-concentration $N^-$-type impurity layer 4. In this comparative example, since the impurity concentration of the $N^-$-type impurity layer 4 is small and the resistance is great, comparatively greater voltage drop occurs. Then, when the current is further increased, the collector potential continues to increase up to the breakdown voltage $V_{t2}$ in accordance with the collector resistance of the NPN transistor. Then, thermal runaway occurs due to the heat generation within the transistor, and it leads to the breakdown (breakdown point: ($V_{t2}$, $I_{t2}$) in FIG. 9).

As described above, regarding the operation of the electrostatic protection element in the comparative example, as shown in FIG. 9, the holding voltage $V_h$ will never be the operating upper limit voltage $V_A$ or less of the internal elements comprising the internal circuit; however, the operating voltage, i.e., the voltage $V_{tr2}$ at the second trigger point shall exceed the irreversible breakdown voltage $V_B$ of the internal elements. Therefore, the electrostatic protection element will never function as a protection element of the internal circuit 40 as is. Then, in order to adjust the voltage $V_{tr2}$ at the second trigger point at the irreversible breakdown voltage $V_B$ or less of the internal elements, a measure to insert a protection resistance 50 into a front stage of the internal circuit in series at a connecting point between the I/O PAD 30 and the collector of the electrostatic protection point has to be adopted as shown in FIG. 8. As described above, since it is necessary to insert the protection resistance 50 in series in the electrostatic protection element of the comparative example, a chip area is increased by the protection resistance 50. In addition, in a circuit configuration where the protection resistance 50 cannot be inserted due to a circuit characteristic, it is difficult to protect the internal circuit 40.

In the meantime, in the electrostatic protection element of this embodiment, because the voltage $V_{tr2}$ at the second trigger point can be adjusted at the irreversible breakdown voltage $V_B$ or less, the protection resistance 50 is not required. Therefore, any additional process to form the protection resistance 50 is also not required.

As described above, in the electrostatic protection element having the thyristor structure relating to the present invention, since the holding voltage $V_h$ is the operating upper limit voltage $V_A$ or greater of the internal elements comprising the internal circuit and the operating voltage $V_{tr}$ is the irreversible breakdown voltage $V_B$ or less of the internal elements, the high breakdown voltage semiconductor element comprising the internal circuit can be protected. Further, it is unnecessary to add any special process in addition to the processes required for a semiconductor element mounted onto the same semiconductor substrate.

Further, in the region to operate as the thyristor (region Y in FIG. 2), both electrons and holes contribute to the operating current (become carrier charges). Consequently, elements having the same level of current capability to a surge protection can be formed with a small area compared to an electrostatic protection element with a conventional NPN transistor structure. Therefore, the area of the electrostatic protection element for protecting high breakdown voltage elements can be reduced.

Furthermore, the embodiment explained above does not limit the technical scope of the present invention, but various modifications and/or applications are possible within the scope without departing from the scope of the technical concept of the present invention. For example, the $N^{---}$-type impurity layer 3 can be an impurity region having a low impurity concentration. Therefore, the $N^{---}$-type impurity layer 3 is not an impurity layer having the concentration distribution in the depth direction by the impurity introduction from the substrate surface but can be an impurity layer formed by uniform concentration epitaxial growth. Further, in the above embodiment, a case where the junction depth of the $N^-$-type impurity layer 4 is adjusted to be the same as that of the $N^{---}$-type impurity layer 3 was explained. However, the junction depth should be deeper than that of the second impurity layer 5. Also, in the viewpoint to form the current pathway that is flowed flows at the time of bipolar action, the junction depth of the $N^-$-type impurity layer 4 can be deeper than that of the $N^{---}$-type impurity layer 3. In this case, an electrostatic protection element of the semiconductor integrated circuit device that is stronger against the breakdown can be realized.

The present invention can provide an electrostatic protection element that can protect an internal circuit without formation of a special diffusion layer or insertion of a protection resistance, and whose area is small, and is useful as an electrostatic protection element.

What is claimed is:

1. An electrostatic protection element to be provided in a semiconductor substrate, comprising: a semiconductor substrate of a first conductivity type; a first impurity layer of a second conductivity type, which is a conductivity type opposite to the first conductivity type, provided in the semiconductor substrate; a second impurity layer of the first conductivity type provided in the first impurity layer functioning as a gate; a third impurity layer of the second conductivity type provided in the second impurity layer functioning as a cathode; a fourth impurity layer of the second conductivity type provided in the first impurity layer spaced apart from the second impurity layer at a distance; a fifth impurity layer of the first conductivity type provided in the fourth impurity layer functioning as an anode; and a sixth impurity layer of the second conductivity type provided in the fourth impurity layer, wherein an impurity concentration of the fourth impurity layer is higher than that of the first impurity layer, and a bottom of the fourth impurity layer is deeper than that of the second impurity layer.

2. An electrostatic protection element according to claim 1, wherein an impurity concentration of the fifth impurity layer is higher than that of the fourth impurity layer.

3. An electrostatic protection element according to claim 1, wherein
the electrostatic protection element is incorporated into a semiconductor device having an input/output terminal, a power supply terminal and a circuit to be protected, and
the second impurity layer and the third impurity layer are commonly connected to the lowest potential of the semiconductor device; and the fifth impurity layer and the sixth impurity layer are commonly connected to both the input/output terminal and the circuit to be protected.

4. An electrostatic protection element according to claim 2, wherein
the electrostatic protection element is incorporated into a semiconductor device having an input/output terminal, a power supply terminal and a circuit to be protected, and
the second impurity layer and the third impurity layer are commonly connected to the lowest potential of the semiconductor device; and the fifth impurity layer and the sixth impurity layer are commonly connected to both the input/output terminal and the circuit to be protected.

5. An electrostatic protection element according to claim 1, wherein
the electrostatic protection element is incorporated into a semiconductor device having an input/output terminal, a power supply terminal and a circuit to be protected, and
the second impurity layer and the third impurity layer are commonly connected to the lowest potential of the semiconductor device; and the fifth impurity layer and the sixth impurity layer are commonly connected to both the power supply terminal and the circuit to be protected.

6. An electrostatic protection element according to claim 2, wherein
the electrostatic protection element is incorporated into a semiconductor device having an input/output terminal, a power supply terminal and a circuit to be protected, and
the second impurity layer and the third impurity layer are commonly connected to the lowest potential of the semiconductor device; and the fifth impurity layer and the sixth impurity layer are commonly connected to both the power supply terminal and the circuit to be protected.

7. An electrostatic protection element according to claim 3, wherein the fifth impurity layer and the sixth impurity layer are independently connected to the circuit to be protected, respectively.

8. An electrostatic protection element according to claim 5, wherein the fifth impurity layer and the sixth impurity layer are independently connected to the circuit to be protected, respectively.

9. An electrostatic protection element according to claim 1, wherein the first impurity layer is an epitaxial layer.

10. An electrostatic protection element according to claim 2, wherein the first impurity layer is an epitaxial layer.

11. An electrostatic protection element according to claim 1, wherein a bottom of the fourth impurity layer is deeper than or a same as that of the first impurity layer.

12. An electrostatic protection element according to claim 2, wherein a bottom of the fourth impurity layer is deeper than or a same as that of the first impurity layer.

13. An electrostatic protection element according to claim 1, wherein the electrostatic protection element is incorporated into a semiconductor device having a circuit to be protected including a high breakdown voltage semiconductor element provided in a well layer of the second conductivity type and a low breakdown voltage semiconductor element provided in a well layer of the second conductivity type, and the well layer where the high breakdown voltage semiconductor element is provided and the first impurity layer have a same impurity profile, and the well layer where the low breakdown voltage semiconductor element is provided and the fourth impurity layer have a same impurity profile.

14. An electrostatic protection element according to claim 2, wherein the electrostatic protection element is incorporated into a semiconductor device having a circuit to be protected including a high breakdown voltage semiconductor element provided in a well layer of the second conductivity type and a low breakdown voltage semiconductor element provided in a well layer of the second conductivity type, and the well layer where the high breakdown voltage semiconductor element is provided and the first impurity layer have a same impurity profile, and the well layer where the low breakdown voltage semiconductor element is provided and the fourth impurity layer have a same impurity profile.

15. An electrostatic protection element according to claim 13, wherein the circuit to be protected contains a semiconductor element having a contact layer including a high-concentration impurity layer of the first conductivity type and a semiconductor element having a contact layer including a high-concentration impurity layer of the second conductivity type, and the contact layer of the first conductivity type and the fifth impurity layer have a same impurity profile, and the contact layer of the second conductivity type, the third impurity layer and the sixth impurity layer have a same impurity profile.

16. An electrostatic protection element according to claim 14, wherein the circuit to be protected contains a semiconductor element having a contact layer including a high-concentration impurity layer of the first conductivity type and a semiconductor element having a contact layer including a high-concentration impurity layer of the second conductivity type, and the contact layer of the first conductivity type and the fifth impurity layer have a same impurity profile, and the contact layer of the second conductivity type, the third impurity layer and the sixth impurity layer have a same impurity profile.

* * * * *